United States Patent
Tsu et al.

(10) Patent No.: US 8,846,506 B2
(45) Date of Patent: Sep. 30, 2014

(54) ENHANCED ELECTRON MOBILITY AT THE INTERFACE BETWEEN GD$_2$O$_3$(100)/N-SI(100)

(71) Applicants: Raphael Tsu, Huntersville, NC (US); Wattaka Sitapura, Charlotte, NC (US); John Hudak, Charlotte, NC (US)

(72) Inventors: Raphael Tsu, Huntersville, NC (US); Wattaka Sitapura, Charlotte, NC (US); John Hudak, Charlotte, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 0 days.

(21) Appl. No.: 13/867,380

(22) Filed: Apr. 22, 2013

(65) Prior Publication Data

US 2013/0285048 A1    Oct. 31, 2013

Related U.S. Application Data

(60) Provisional application No. 61/638,530, filed on Apr. 26, 2012.

(51) Int. Cl.

| | |
|---|---|
| H01L 21/20 | (2006.01) |
| C30B 29/16 | (2006.01) |
| H01L 29/51 | (2006.01) |
| C23C 14/24 | (2006.01) |
| H01L 21/28 | (2006.01) |
| H01L 29/24 | (2006.01) |
| C23C 14/08 | (2006.01) |
| C30B 23/02 | (2006.01) |
| H01L 21/02 | (2006.01) |
| H01L 29/78 | (2006.01) |

(52) U.S. Cl.
CPC ............... *H01L 29/24* (2013.01); *C30B 29/16* (2013.01); *H01L 29/517* (2013.01); *C23C 14/24* (2013.01); *H01L 21/28008* (2013.01); *C23C 14/08* (2013.01); *C30B 23/025* (2013.01); *H01L 29/7839* (2013.01); *H01L 21/02192* (2013.01); *H01L 21/28194* (2013.01); *H01L 21/28185* (2013.01); *H01L 21/02293* (2013.01); *H01L 21/02269* (2013.01); *H01L 21/02565* (2013.01)
USPC .................................... 438/489; 257/E21.131

(58) Field of Classification Search
USPC .......... 438/481, 486, 489, 778; 257/E21.091, 257/E21.131
See application file for complete search history.

(56) References Cited

U.S. PATENT DOCUMENTS 7,927,661 B2 *    4/2011    Jones ....................... 427/255.31

OTHER PUBLICATIONS

Sitaputra et al.; "Enhancement in Electron Mobility at the Interface between Gd$_2$O$_3$(100) and n-type Si(100);" May 6, 2012; http://ecst.ecsdl.org/content/45/6/185.abstract.
Sitaputra et al; "Effects of substrate doping on Gd2O3(100)/Si(100) heterostructure;" J. Vac. Sci. Technol. A 31(2); Mar./Apr. 2013; 021509-1-021509-4.
Cen et al; "Oxide Nanoelectronics on Demand;" Science; vol. 323; Feb. 20, 2009; pp. 1026-1030; www.sciencemag.org.

(Continued)

*Primary Examiner* — Quoc Hoang
(74) *Attorney, Agent, or Firm* — Oliff PLC

(57) ABSTRACT

A multilayered structure is provided. The multilayered structure may include a silicon substrate and a film of gadolinium oxide disposed on the silicon substrate. The top surface of the silicon substrate may have silicon orientated in the 100 direction (Si(100)) and the gadolinium oxide disposed thereon may have an orientation in the 100 direction (Gd$_2$O$_3$(100)).

14 Claims, 11 Drawing Sheets

(56) References Cited

OTHER PUBLICATIONS

Pentcheva et al; "Charge localization or itineracy at $LaAlO_3/SrTiO_3$ interfaces: Hole polarons, oxygen vacancies, and mobile electrons;" Physical Review B 74; The American Physical Society; 2006; pp. 035112-1-035112-7.

Ohtomo et al; "A high-mobility electron gas at the $LaAlO_3/SrTiO_3$ heterointerface;" Nature Publishing Group; vol. 427; Jan. 29, 2004; pp. 423-426 (with Erratum).

Sitaputra et al.; "Defect induced mobility enhancement: Gadolinium oxide (100) on Si(100);" Applied Physics Letters; vol. 101; Nov. 6, 2012; pp. 222903-1-222903-4.

\* cited by examiner

ENHANCED ELECTRON MOBILITY AT THE INTERFACE BETWEEN $GD_2O_3(100)/N$-$SI(100)$

CROSS-REFERENCE TO RELATED APPLICATIONS

The present application is a non-provisional application of U.S. Provisional Patent Application No. 61/638,530, entitled "ENHANCED ELECTRON MOBILITY AT THE INTERFACE BETWEEN $GD_2O_3(100)/N$—$SI(100)$" and filed on Apr. 26, 2012.

BACKGROUND

Semiconductor devices are devices which are in current use in various electronic devices. They form the basis of most complex electronics. The speed of the semiconductor components (e.g., MOSFETs) determine the speed of the electronic devices. The semiconductor components are multilayered devices which allow electron to move from one contact to another. The speed of such contact is currently limited and thus, the devices can only perform to a certain level.

SUMMARY

Embodiments of the present invention relate to materials and in particular new materials to be used in electronic devices such as a more efficient field effect transistors and other semiconductor devices.

Embodiments of the present invention provides an enhancement in electron mobility which was found at the interface between a gadolinium oxide ($Gd_2O_3$) layer with (100) orientation on an n-type Si(100) substrate that forms the basis of a semiconductor device (e.g., a MOSFET). The epitaxial growth of the $Gd_2O_3(100)$ on both n-type and p-type Si(100) is obtained when the $Gd_2O_3$ is deposited on a hydrogen-passivated, unreconstructed Si(100) surface at the substrate temperature of 200° C. and the oxygen partial pressure is in the range of $10^{-7}$-$10^{-6}$ Torr. This enhancement in carrier mobility can be found when the silicon substrate is n-type. The mobility of 1760 $cm^2/V \cdot s$ was observed at room temperature, being several times the value for carrier concentration ~$10^{18}$ $cm^{-3}$. The accumulation of the electrons at the interface with mobility enhancement arises from the two-dimensional confinement is similar to schemes of transfer doping. Together with a bias with a Schottky metal contact serving to modulate the 2D carriers, a more efficient field effect transistor is in the making.

In one aspect, a multilayered structure is provided. The multilayered structure may include a silicon substrate and a film of gadolinium oxide disposed on the silicon substrate. The top surface of the silicon substrate may have silicon orientated in the 100 direction (Si(100)) and the gadolinium oxide disposed thereon may have an orientation in the 100 direction ($Gd_2O_3(100)$).

In another aspect, a method for forming a multilayered structure may include providing a silicon substrate to a deposition apparatus; providing gadolinium oxide ($Gd_2O_3$) to the deposition apparatus; pressurizing the pressurized deposition apparatus to a predetermined pressure; heating the silicon substrate to a predetermined temperature; and evaporating the gadolinium oxide so that the gadolinium oxide orientated in the 100 direction ($Gd_2O_3$ (100)) is grown on a layer of the silicon substrate having an orientation in the 100 direction (Si(100)).

DESCRIPTION OF THE DRAWINGS

The objects and features of the invention can be better understood with reference to the drawings described below, and the claims. The drawings are not necessarily to scale, emphasis instead generally being placed upon illustrating the principles of embodiments of the invention. In the drawings, like numerals are used to indicate like parts throughout the various views.

DETAILED DESCRIPTION

Figure 1:
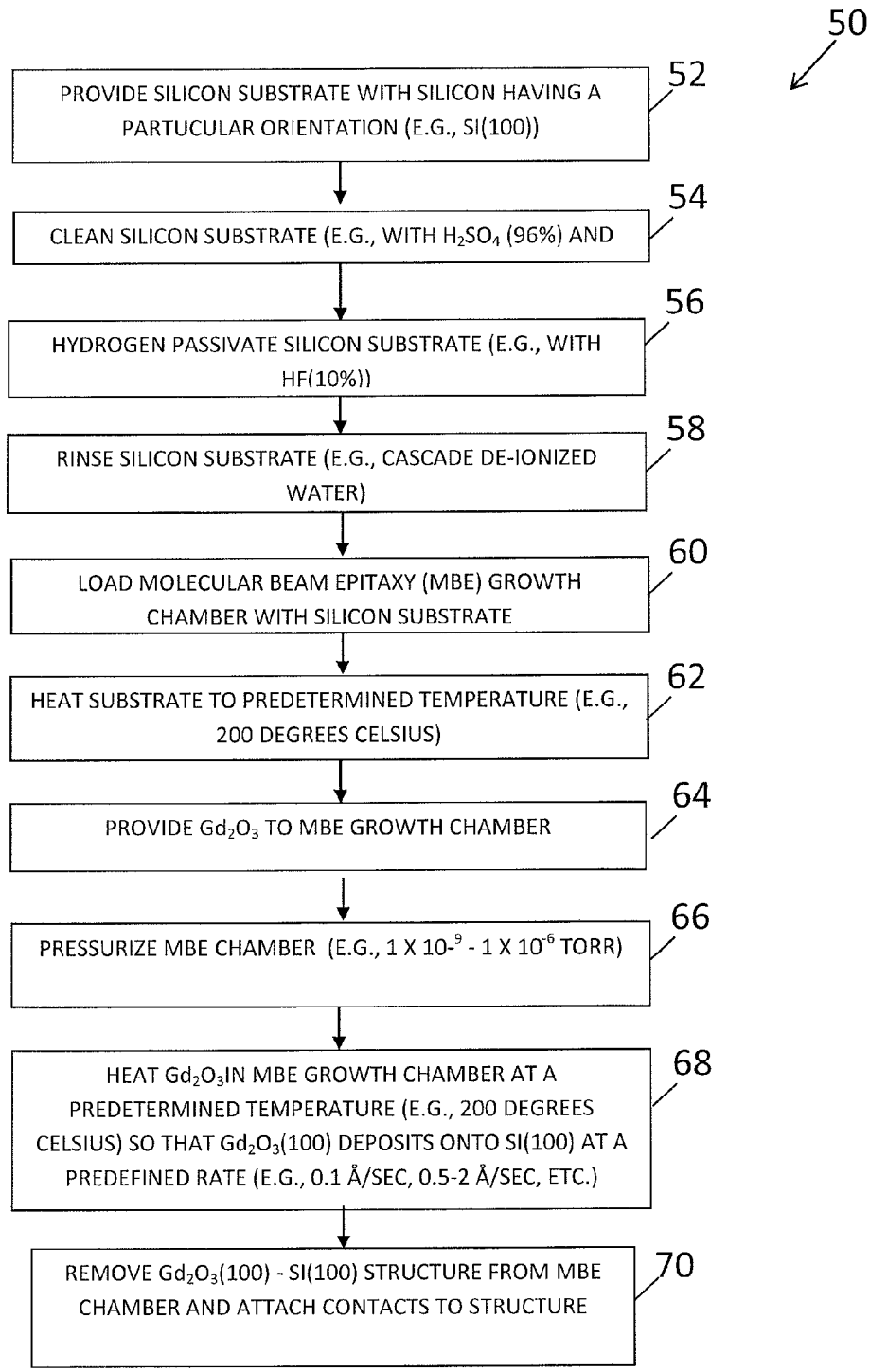
FIG. 1 illustrates a method of forming a structure that has enhanced electron mobility at an interface, according to one embodiment.

Embodiments of the present invention now will be described more fully hereinafter in the following detailed description, in which some, but not all embodiments of the invention are described. Indeed, this invention may be embodied in many different forms and should not be construed as limited to the embodiments set forth herein; rather, these embodiments are provided so that this disclosure will satisfy applicable legal requirements. The following description provides specific details for a thorough understanding and enabling description of these examples. One skilled in the art will understand, however, that the invention may be practiced without many of these details. Additionally, some well-known structures or functions may not be shown or described in detail, so as to avoid unnecessarily obscuring the relevant description.

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all teems (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

Embodiments of the present disclosure relate to enhancing the electron mobility in semiconductor devices. For example, some embodiments relate to depositing gadolinium oxide onto a silicon substrate to product a field effect transistor, resulting in an enhanced electron mobility at the interface of gadolinium oxide and the silicon substrate.

Forming $Gd_2O_3$ (100)/Si(100) Structure

FIG. 1 illustrates a method of forming a multilayered structure that has enhanced electron mobility, according to one embodiment. At block 52, a silicon wafer or substrate is provided. The silicon substrate may be n-type or p-type. Additionally, as discussed later, silicon with a selected Miller index of 100 plane is represented herein as Si(100).

In block 54, the silicon substrate is cleaned using a cleaning solution, such as a piranha solution or etch ($H_2SO_4$:H2O2). The solution may be a $H_2SO_4$ (96%) and $H_2O_2$(30%). The cleaning solution removes most organic matter so that the silicon substrate is effectively clean.

In block 56, the as-cleaned substrate may be hydrogen passivated. Hydrogen passivation relates to etching the surface of the silicon substrate with an etching agent, such as a hydrogen flouride aqueous solution (10%) which leaves the surface silicon atoms covalently bonded to hydrogen.

In block 58, the silicon substrate is rinsed. This may be accomplished by submerging the silicon substrate in de-ionized water.

In block 60, the silicon substrate may then be immediately loaded into the ultra-high vacuum chamber ($10^{-9}$ Torr) or a high pressure apparatus, such as a molecular beam epitaxy (MBE) growth chamber. Molecular beam epitaxy is one of several methods of depositing single crystals onto a substrate. The molecular beam epitaxy may takes place in high vacuum or ultra-high vacuum ($10^{-8}$ Pa). In MBE systems, the deposition rate (typically less than 3000 nm per hour) allows the films to grow epitaxially. These deposition rates may require proportionally better vacuum to achieve the same impurity levels as other deposition techniques. The absence of carrier gases as well as the ultra-high vacuum environment may result in the highest achievable purity of the grown films. In solid-source MBE, elements such as gallium and arsenic, in ultra-pure form, are heated in separate quasi-Knudsen effusion cells until they begin to slowly sublime. The gaseous elements then condense on the wafer, where they may react with each other. The term "beam" means that evaporated atoms do not interact with each other or vacuum chamber gases until they reach the wafer, due to the long mean free paths of the atoms.

During operation of a MBE system, reflection high energy electron diffraction (RHEED) is often used for monitoring the growth of the crystal layers. A computer controls shutters in front of each furnace, allowing precise control of the thickness of each layer, down to a single layer of atoms. Intricate structures of layers of different materials may be fabricated this way. Such control has allowed the development of structures where the electrons can be confined in space, giving quantum wells or even quantum dots. Such layers form semiconductor devices, including FETs.

While it is stated that a MBE chamber may be employed, it should be understood that other methods and devices (e.g., e-beam evaporation device) may alternatively be used herein, such as electron beam evaporation or any other device which can deposit a thin film on a surface. Therefore, the present invention should not be so limited to being deposited using a MBE chamber.

In block 62, the silicon substrate is heated up slowly to a predetermined temperature (e.g., 200° C. with the rate of 10° C./min) in order to preserve an unreconstructed surface. The unreconstructed surface is maintained before the growth; otherwise, the $Gd_2O_3$ (111) might be grown instead.

In block 64, gadolinium oxide is provided to the MBE growth chamber. Gadolinium oxide is an inorganic compound with a formula of $Gd_2O_3$ and can be formed by thermal decomposition of the hydroxide, nitrate, carbonate, or oxalates (and may form on the surface of gadolinium metal). Gadolinium oxide is lattice matched to twice of unit cell of silicon to within 0.5%. In addition, this oxide has a reasonably large band gap of 5.98 eV and a proper conduction and valence band-offset with respect to silicon of 2.08 eV and 2.78 eV, respectively. A dielectric constant of the $Gd_2O_3$, 13-18, is also approximately four times higher than $SiO_2$. Together with a thermodynamic stability with the silicon, $Gd_2O_3$ complies with the requirements imposed by further scaling and may serve to replace $SiO_2$.

During growth, $Gd_2O_3$ may have an orientation in the Miller index of 100, 111 or 110 as represented by $Gd_2O_3$ (100), $Gd_2O_3$ (111) or $Gd_2O_3$ (110), respectively. In one embodiment herein, $Gd_2O_3$ (100) is grown on the substrate.

In block 66, the MBE chamber is pressurized with the silicon substrate and $Gd_2O_3$ material disposed in the MBE chamber. In one embodiment, the MBE chamber is pressurized to $1\times10^{-9}$ Torr. In another embodiment, the MBE chamber is pressurized in the range of $3\times10^{-9}$ to $1\times10^{-6}$ Torr.

In block 68, the $Gd_2O_3$ material in the MBE chamber is heated to 200° C. The $Gd_2O_3$ material then evaporates into atomic particles in the MBE chamber. The $Gd_2O_3$ particles then are deposited (i.e., grown) onto the surface of the silicon substrate at 200° C. with a relatively slow rate (e.g., 0.1 Å/s) and sufficient oxygen supply. In this regard, $Gd_2O_3(100)$ is grown on Si(100) and, as such, may be grown to any desired thickness. The thickness of the $Gd_2O_3(100)$ layer on the substrate may be between 20 nm and 150 nm. In one embodiment, the thickness of the $Gd_2O_3(100)$ layer on the substrate with Si(100) is about 50 nm. After the desired thickness is obtained, the epitaxial growth is discontinued and the resulting structure of $Gd_2O_3$ (100) on Si(100) can be removed from the MBE chamber (block 70).

Figure 2:
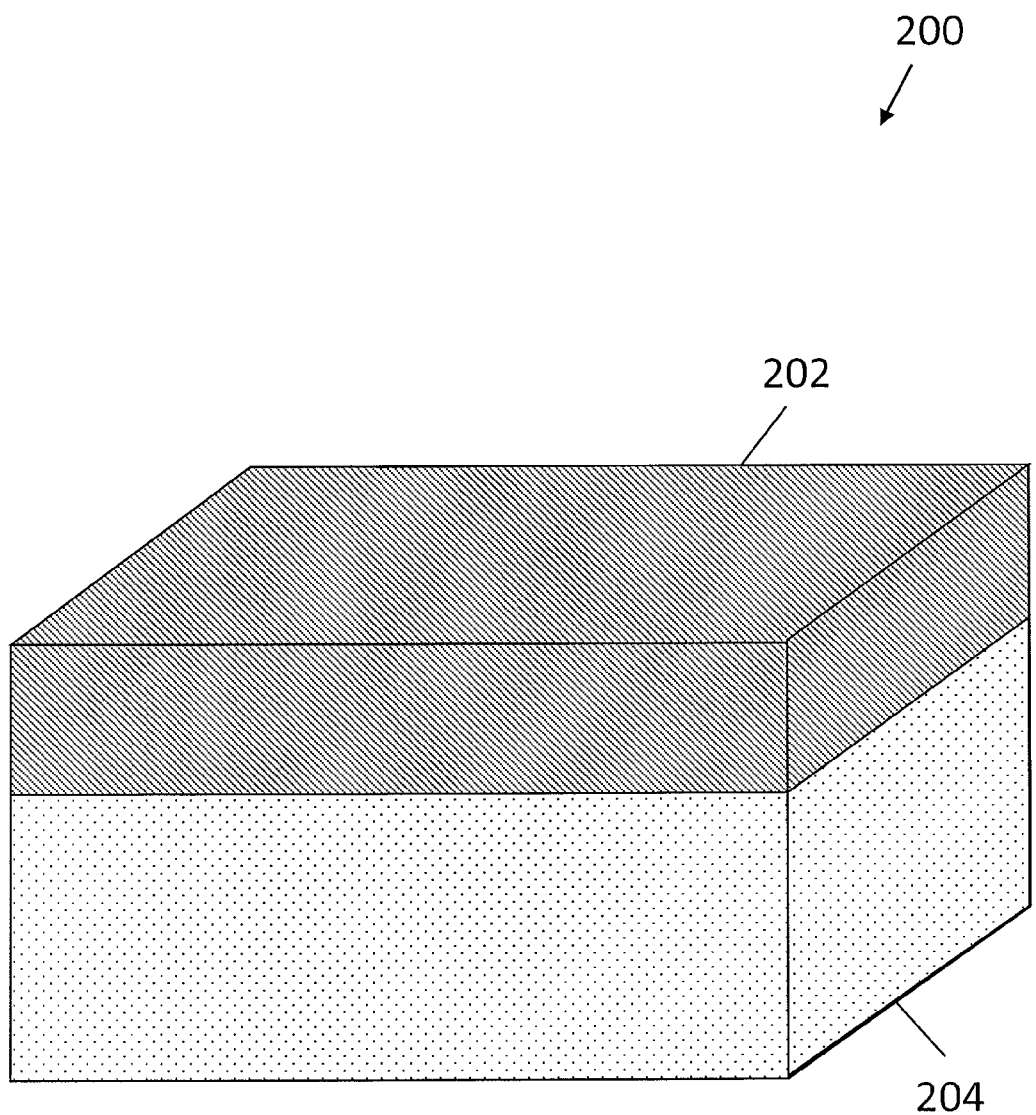
FIG. 2 illustrates an example of a structure having a $Gd_2O_3$ (100) layer and a Si(100) layer, according to one embodiment.

FIG. 2 illustrates an example of the resulting $Gd_2O_3$ (100) on Si(100) structure at 200. Multiple layers are illustrated, including Si(100) at 204 as the base substrate and $Gd_2O_3$ (100) at 202.

Figure 3:
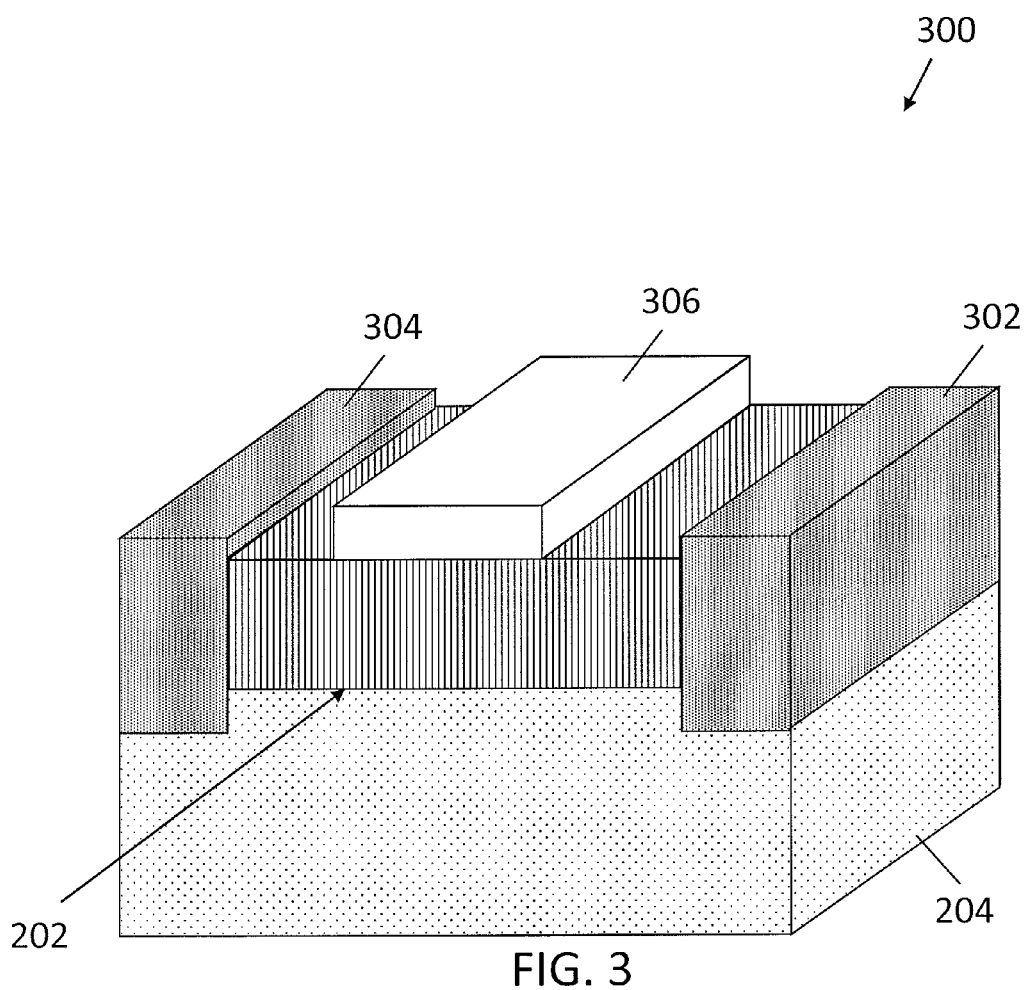
FIG. 3 illustrates an "inverse" MOSFET configuration using the structure of FIG. 2 illustrates wherein (100)-oriented $Gd_2O_3$ is used as a gate dielectric according to one embodiment according to one embodiment.

At this point, metallic contacts may be deposited or conductively attached to the $Gd_2O_3(100)$ on Si(100) structure in such a configuration to form a semiconductor device, such as a field effect transistor (FET). For example, as illustrated in FIG. 3, contacts 302, 304 and 306 may be added to the $Gd_2O_3$ (100) on Si(100) structure 200. Contact 302 may be a drain, contact 304 may be a source and contact 306 may be a gate of a MOSFET device. These contacts may be made of aluminum. Aluminum forms a Schottky contact with lightly doped n-type silicon. However, in a heavily doped n-type silicon, aluminum will form a tunneling ohmic contact due to a narrower Schottky barrier. Thus, the aluminum contact will form an ohmic contact with the accumulation region close to the interface between the $Gd_2O_3$ and Si while maintaining the Schottky contact with the other region of the silicon substrate. In other words, the scheme is normally on MOSFETs, because the conduction path exists without the application of a gate voltage, but can be turned off with the application of the reverse bias at the gate.

Properties of $Gd_2O_3$ (100)/Si(100) Structure

The below discussion relates to the properties of the $Gd_2O_3$ (100) on Si(100) structure 200 and the resulting effects thereof including enhanced electron mobility.

Figure 4A:
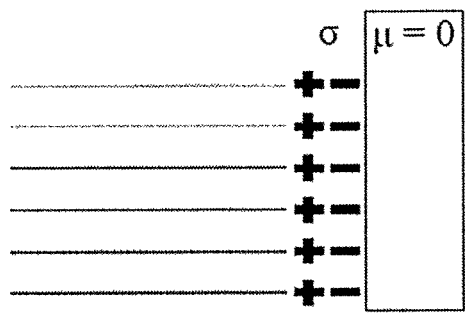
FIG. 4A illustrates an ionic stacking sequence of $Gd_2O_3$ (111) according to one embodiment.
Figure 4B:
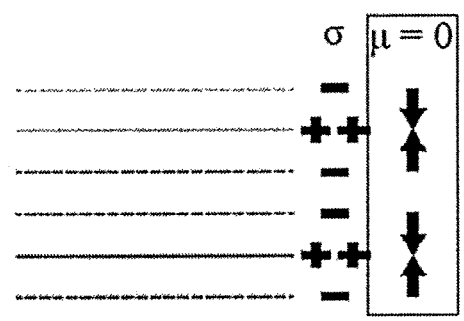
FIG. 4B illustrates an ionic stacking sequence of $Gd_2O_3$ (110) according to one embodiment.

The growth of $Gd_2O_3(111)$ on Si(100) using a molecular beam epitaxy (MBE) technique can be found at a lower temperature as a defective growth while the growth of (110)-oriented $Gd_2O_3$ can be grown as an epitaxial layer at a higher temperature, in the range of 670-700° C., resulting in a high quality epitaxial growth of $Gd_2O_3(110)$ on Si(100). As illustrated in FIGS. 4A and 4B, the type I and II ionic stacking sequences show no net dipole moment perpendicular to the surfaces of $Gd_2O_3(110)$ and $Gd_2O_3(111)$, respectively. This is because either the individual dipole moments in the stacking sequences are zero or cancel out with adjacent dipole moments.

Figure 4C:
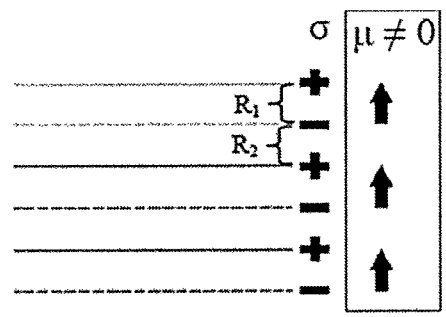
FIG. 4C illustrates an ionic stacking sequence of $Gd_2O_3$ (100) according to one embodiment.
Figure 5A:
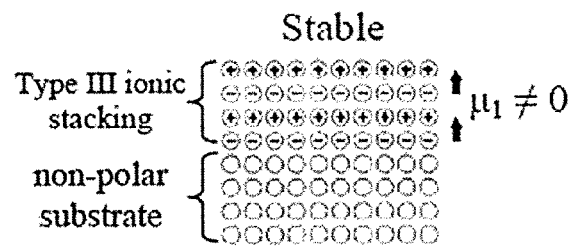
FIG. 5A illustrates the stability of a type III ionic crystal layer grown on a non-polar substrate according to one embodiment.

$Gd_2O_3(100)$ may also be grown on Si(100) using the MBE as is disclosed above with respect to FIG. 1. Due to its atomic arrangement, the $Gd_2O_3(100)$ grown on Si(100) has a net dipole moment perpendicular to the surface, as illustrated in FIG. 4C and FIG. 5A. This net dipole moment contributes to an extra stored energy within the $Gd_2O_3(100)$ layer. The dynamics of the dipole energy is similar to the strained layer, being unstable exceeding certain thickness. As the thickness of layer increases, there is a need for a charge reconfiguration at the interface similar to surface reconstruction, to eliminate the net dipole moment and lower the stored energy (as shown from the progression of FIG. 5B to FIG. 5C). In other words, as the layer gets thicker, the stored energy becomes high enough to create defects, and such defects can be regarded as an atomic rearrangement in order to cancel out the net dipole moment and reduce the energy of the system.

In the case of $Gd_2O_3(100)/Si(100)$, the $Gd_2O_3$ layer is normally terminated with the oxygen layer when it is in contact with Si(100) so that an oxygen layer is in contact with the Si(100). The reconfiguration of charge at the interface between $Gd_2O_3(100)$ and Si(100) generates oxygen vacancies which provides extra electrons from the gadolinium available to be transferred to the adjacent silicon. In other words, these oxygen vacancies act like donors to provide excess electrons to the silicon, similar to injecting electrons to an n-type silicon. If the silicon substrate is p-type, the transferred electrons will recombine with holes in the silicon, with a Fermi level near the valence band. This kind of electron transfer is similar to doping, not limited by the solid solubility limit. In the above discussed embodiment of FIG. 1, the electron concentration transferred can be much higher than the solid solubility limit and might even approach metallic like concentration because there is no atoms being introduced into the silicon, and the electrons are transferred from the adjacent layer. Since the source of the electrons from the defects is located outside of the channel for conduction in the silicon layer, the present invention may be in conformity with modulation doping. The factor that controls the doping concentration in this embodiment is the amount of oxygen vacancies near the $Gd_2O_3(100)/Si(100)$ interface. Then again, a higher oxygen vacancy not only provides a higher doping concentration but also increases scattering sites at the interface. The transfer of electrons (charge reconfiguration) at the interface is discussed in more depth below.

Interfacial Charges Reconfiguration Model

Figure 5B:
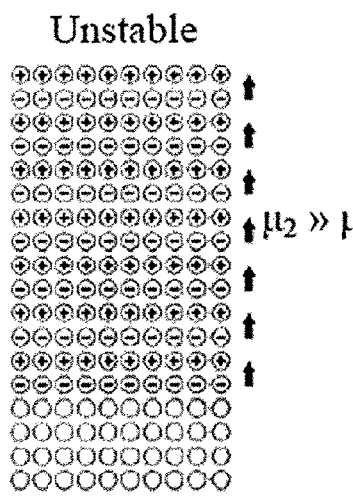
FIG. 5B illustrates the type III ionic crystal layer of FIG. 5A with a greater thickness being unstable on the non-polar substrate according to one embodiment.
Figure 5C:
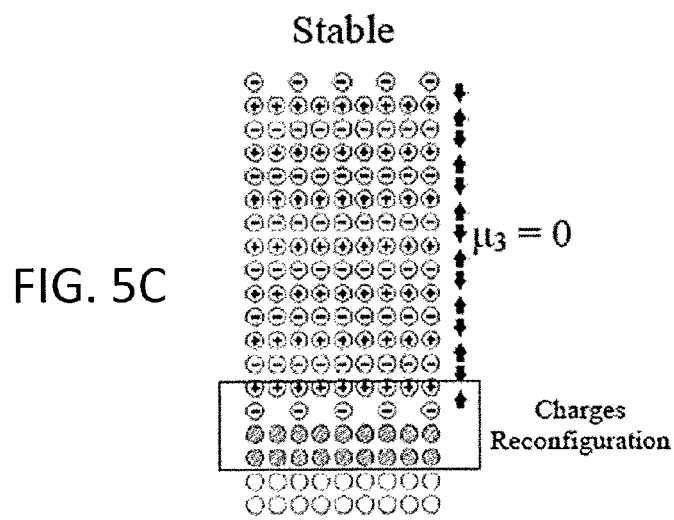
FIG. 5C illustrates the charge reconfiguration when the type III ionic crystal layer of FIG. 5A reaches a predetermined thickness to form a stable layer according to one embodiment.

Charges can be induced or transferred across the interface through various mechanisms. One mechanism is through the lining up of the Fermi level of a homojunction, as well as heterojunctions such as those polar semiconductors, e.g. AlGaN/GaN including the traditional AlGaAs/GaAs. For $Gd_2O_3(100)/Si(100)$ heterojunction, the charge reconfiguration model is quite similar to the case of $LaAlO_3/SrTiO_3$ (LAO/STO) system, although to a lesser degree. In both systems, the type III ionic stacking layer is deposited on top of the non-polar structure. A significantly high electron mobility at the LAO/STO interface was reported due to the transfer of electrons into every other Ti atom near the interface in order to acquiring a more stable configuration by eliminating the net dipole moment within the $LaAlO_3$ layers. Similarly in $Gd_2O_3(100)/Si(100)$ heterostructure, the basic mechanism of charge reconfiguration should be similar to the case of LAO/STO heterostructure. Even though, the titanium has several oxidation states due to the d-shell, providing wider possibilities. The oxygen termination at the interface of the $Gd_2O_3$ layer implies the negative charge termination. In order to cancel the net dipole moment perpendicular to the surface and reduce the stored energy, the charge density of the terminating plane needs to be reduced. Thus, a positive charge particle such as oxygen vacancies need to be introduced to the oxygen terminated plane. The compensate charges ($\sigma c$) required at the interface can be approximated from the below equation, assuming an ideal polar surface where non-planarity is unaccounted for and the atoms are fully ionized.

$$\sigma c^{(1,2)} = \sigma R_{(1,2)}/(R1+R2)$$

where σ is a charge density on each plane and $R_{(1,2)}$ is the separation between planes with different termination, 1 or 2. Assuming the equidistance between charged planes (R1=R2), approximately half of the oxygen in the terminating plane needs to be removed if the reconfiguration were to occur at the terminating layer only (FIGS. 5B-5C). This is not practical in reality. The oxygen vacancies would normally spread out into the inner part of the $Gd_2O_3$ layer with decreasing density as it gets further away from the interface. As a result, the dipole configuration becomes much more complicated. The strain could also come in to play in aiding the reconfiguration by adjusting the magnitude of the dipole moment within the structure.

Figure 6A:
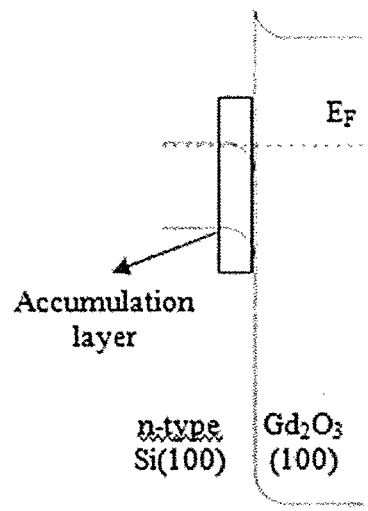
FIG. 6A shows band diagrams showing the accumulation in the conduction band of the n-type silicon according to one embodiment.
Figure 6B:
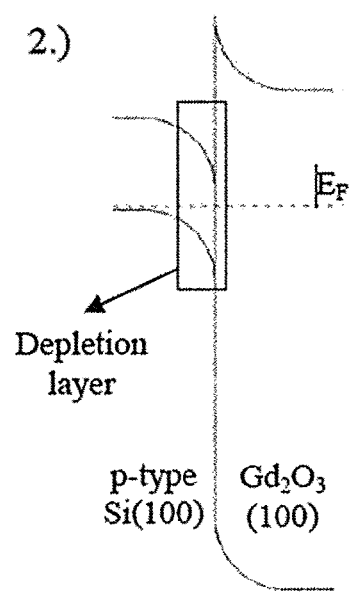
FIG. 6B shows band diagrams showing the accumulation in the conduction band of the p-type silicon according to one embodiment.

Nevertheless, the oxygen vacancies near the interface act like a donor providing excess electrons that would eventually fall into the silicon, as illustrated as dark circles in FIG. 5C. When there is a charge transfer inside a semiconductor, there will be a band bending. The band on the silicon side will bend up as the electrons are transferred into it. This apply to both p-type and n-type substrate. However, in the p-type substrate, the transferred electrons will recombine with holes (FIG. 6B), creating a depletion layer at the interface. On the other hand, the transferred electrons will accumulate in the conduction band of the n-type substrate as there is no hole for them to recombine with (FIG. 6A). These accumulated electrons are confined close to the interface due to the conduction band bending and responsible for the enhanced electron concentration and mobility. Consequently, in order to obtain the heterostructure based on this model, the interfacial layer needs to be eliminated and the oxygen vacancies should be localized near the interface. Nonetheless, once the electrons are transferred into the silicon, the conduction band bends up in response and the electrons are accumulated at the interface between the $Gd_2O_3$ and Si in the case of n-type substrate. This 2-dimensional confinement at the interface gives rise to the enhancement in the electron mobility and the electron mobility of 1760 $cm^2/Vs$ is observed at room temperature, with a carrier concentration ~$10^{18}$ $cm^{-3}$.

Experimental Results

An experiment was conducted and the following are details of the experiment, which are intended to be nonlimiting as an embodiment. In the experiment, p-type and n-type Si(100) wafers with the resistivity 1-20 Ω-cm were cleaned by a standard Piranha cleaning procedure. The wafers were cleaned in the mixed solution between $H_2SO_4$(96%) and $H_2O_2$(30%) with 2:3 ratio for 20 minutes, follow by the HF (10%) for 10 seconds, then, cascade DI water for rinsing. The as-cleaned wafers were loaded into the MBE growth chamber with a base pressure of 1×$10^{-8}$ Torr. The $Gd_2O_3$ source was introduced using electron beam evaporation system with $Gd_2O_3$ powder as a target. A pre-annealing at high temperature was not performed in order to preserve the hydrogen passivation from HF. The effectiveness of the hydrogen passivation was tested in a separate set of experiment by intentionally introduce oxygen plasma to the as-cleaned Si(100) wafer at 300° C. for 5 minutes. The thickness of the native oxide after the exposure measured by the FilMetric interferometer was found to be less than 5 Å, which is much less than a typical native oxide thickness found on bare silicon wafer (25 Å). The $Gd_2O_3$ growth was performed at the substrate temperature of 200° C. As there is no external oxygen source, the moderately high deposition rate, 0.5-2 Å/s, compare to a typical rate reported by others was used in order to provide enough oxygen partial pressure for the growth. The pressure during the growth was in the order of 3×$10^{-7}$-1×$10^{-6}$ Torr. As the generation of the oxygen vacancies becomes significant at the high growth temperature, this low growth temperature not only ensure the reduction of the oxygen vacancy density but also localize them close to the surface/interface. The interdiffusion which is the cause of the formation of the interfacial layer is minimized through this low growth temperature as well as the hydrogen passivation. This growth represents a modification from the method of growing $CeO_2$(100) on Si(100). The crystal structure was characterized by x-ray diffraction (XRD) technique. A van der Pauw contact configuration was made for measuring the carrier mobility and I-V characteristic. As an ohmic contact is required for a Hall mobility measurement. Aluminum is selected as a metal contact for both p-type and n-type silicon substrate. The aluminum is known to form an ohmic contact with p-type silicon substrate but a Schottky contact with a lightly doped n-type silicon substrate. However, the width of the Schottky barrier can be narrowed down by the high electron concentration in the accumulation region close to the interface. If the barrier width is thin enough, electrons can tunnel through the Schottky barrier, thus, exhibiting a tunneling ohmic contact characteristic. An exponential IV curve was observed in a reference n-type Si substrate signifying the Schottky contact while a linear relationship was observed in the $Gd_2O_3$ (100)/n-type Si(100) sample signifying the ohmic contact. By using this method, the electron mobility at the interface between $Gd_2O_3$ and n-type Si(100) can be selectively probed. For higher efficiency, the aluminum contacts were sputtered through a via in the $Gd_2O_3$ layer onto the slightly etched silicon.

Figure 7A:
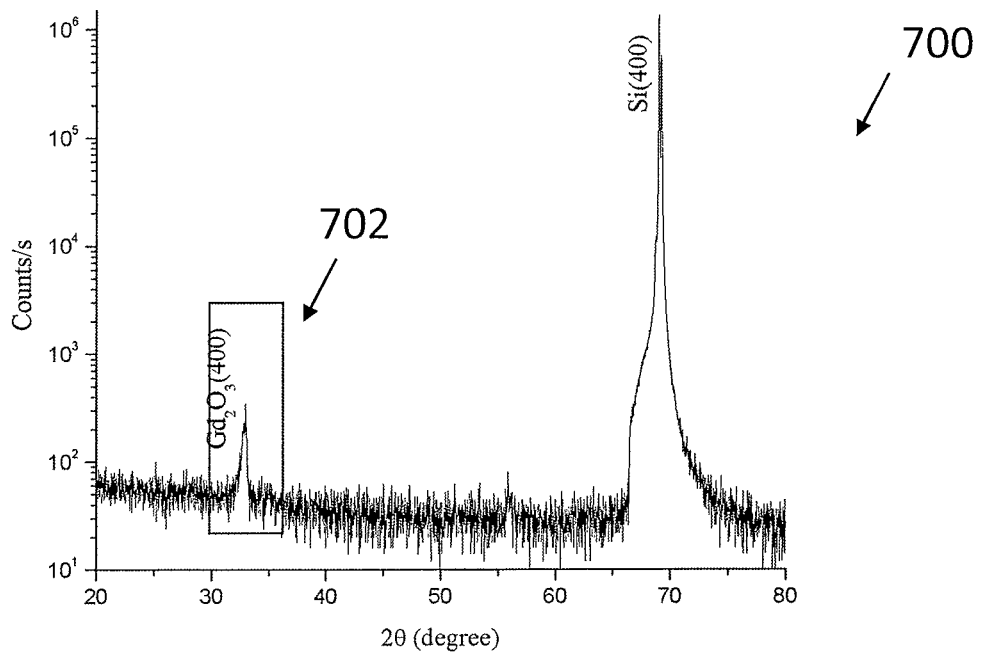
FIG. 7A presents an x-ray diffraction ("XRD") pattern illustrating a polycrystalline of gadolinium oxide, $Gd_2O_3$ (100), grown on p-type silicon according to another embodiment.
Figure 7B:
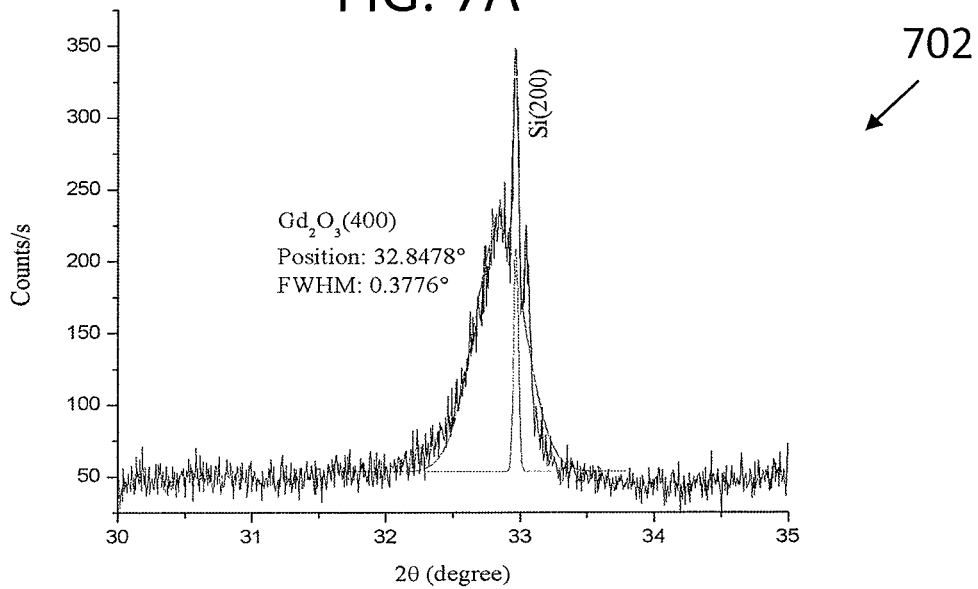
FIG. 7B illustrates a selected portion of the x-ray diffraction ("XRD") pattern of FIG. 7A.

The XRD pattern of the sample with 93 nm thick $Gd_2O_3$ grown on p-type Si(100) substrate (FIGS. 7A-7B) shows a $Gd_2O_3$(400) peak as the only visible $Gd_2O_3$ peak indicating a single crystal structure. FIG. 7A illustrates illustrated the XRD pattern 700 from 20 to 80, which FIG. 7B illustrates the selected section 702 of the XRD pattern of FIG. 7A.

Figure 8:
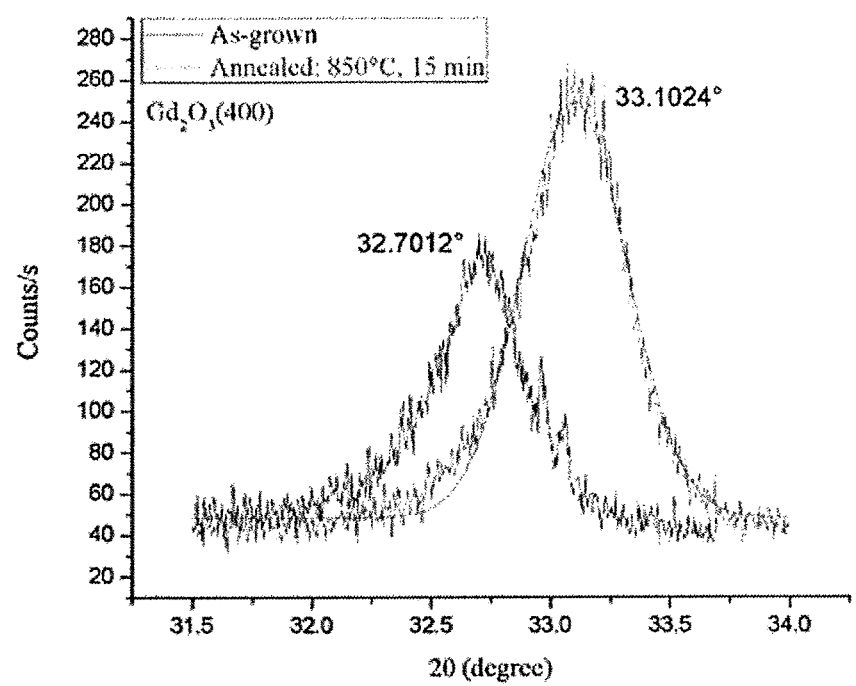
FIG. 8 presents an XRD pattern illustrating a comparison between a $Gd_2O_3(400)$ peak of the as-grown and the annealed samples according to one embodiment.

It should be noted here that the $Gd_2O_3$(100) is strained as the peak is shifted to the lower 2θ angle. This is to be expected as the strain is required in order to aid the interfacial charge reconfiguration. When the sample is annealed at 800° C. with nitrogen gas for 15 minutes, the strain is relaxed and the peak shift back to its proper position as an indication that the charge reconfiguration is carried out through the inter-diffusion at the interface (FIG. 8).

Figure 9A:
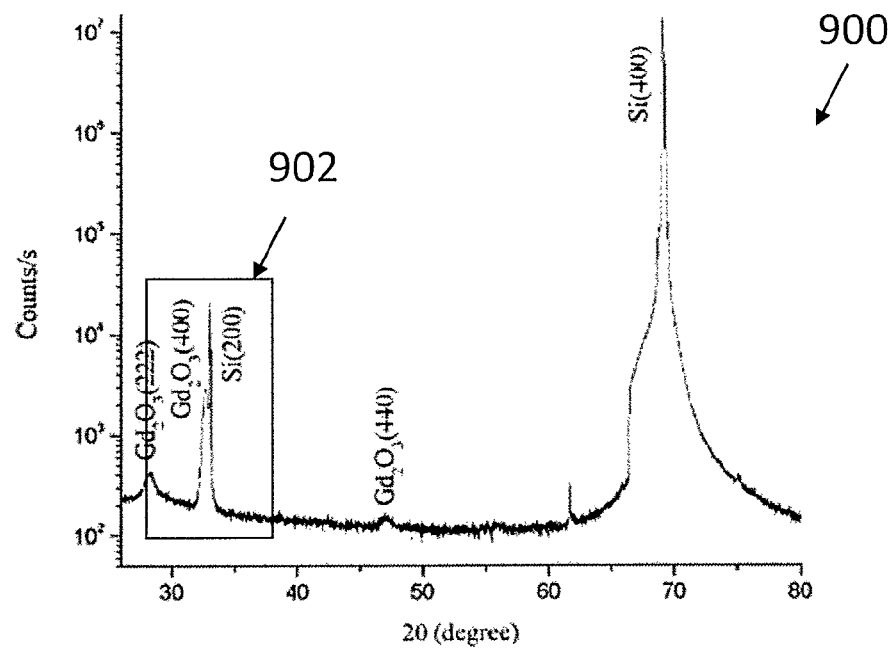
FIG. 9A presents an x-ray diffraction ("XRD") pattern illustrating a polycrystalline of gadolinium oxide, $Gd_2O_3$ (100), grown on n-type silicon according to one embodiment.
Figure 9B:
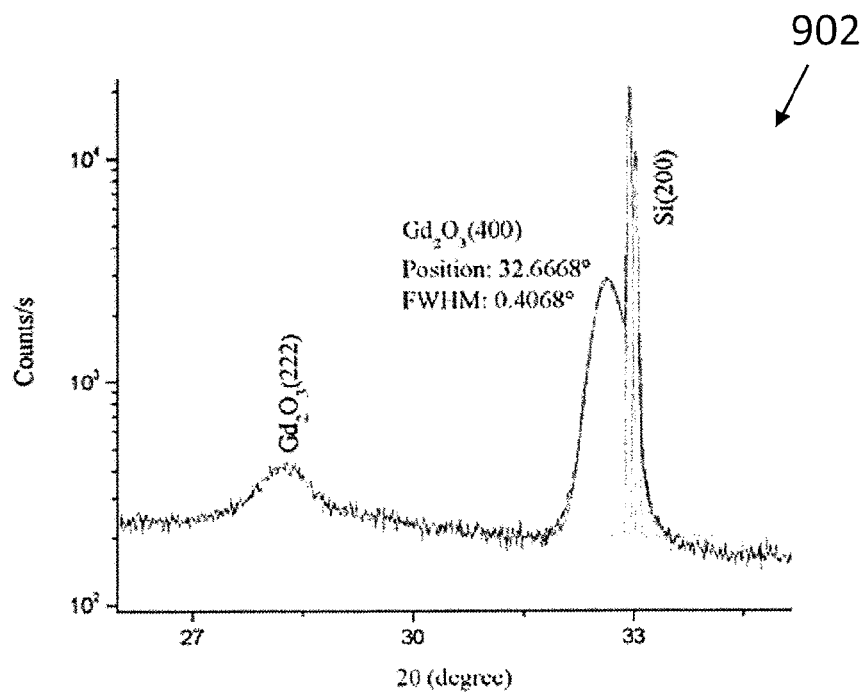
FIG. 9B illustrates a selected portion of the x-ray diffraction ("XRD") pattern of FIG. 9A.

On the other hand, the XRD pattern of the sample with 31 nm-thick $Gd_2O_3$ grown on n-type Si(100) substrate shows a polycrystalline structure with $Gd_2O_3$ (400) peak as a dominant peak, as illustrated in FIGS. 9A-9B. FIG. 9A illustrates illustrated the XRD pattern 900 over a selected range, and FIG. 9B illustrates the selected section 902 of the XRD pattern of FIG. 9A. It should be note here that the $Gd_2O_3$ (400) peak is normally the third highest peak after the $Gd_2O_3$ (222) and $Gd_2O_3$ (440) according to the powder x-ray diffraction from the International Center of Diffraction Data (ICDD) database. This indicates that the $Gd_2O_3$ (100) structure is strongly localized near the interface as the substrate orientation strongly constrained the growth orientation. Thus, the previously mentioned model should still apply within a good approximation.

Figure 10A:
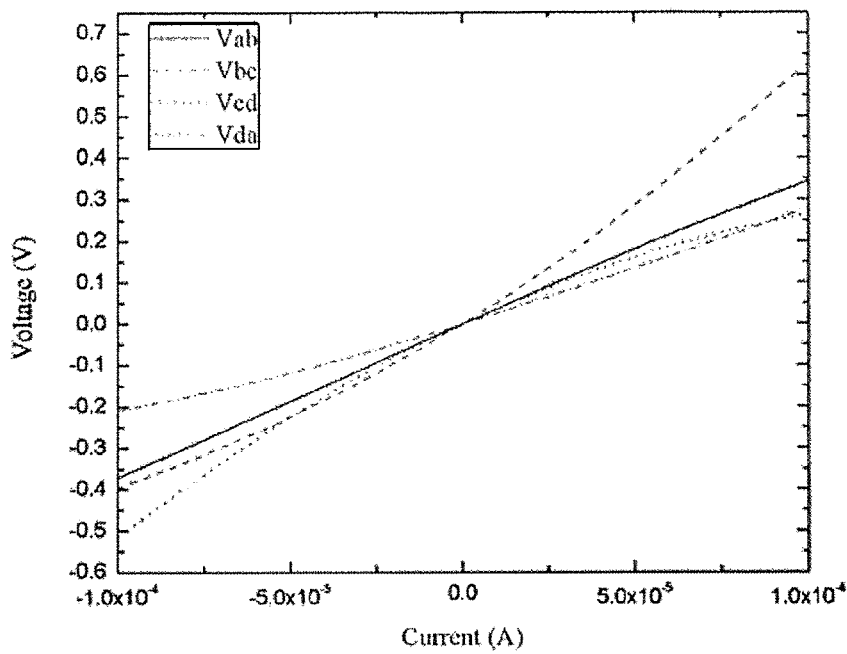
FIG. 10A illustrate an I-V characteristic of samples grown on n-type Si(100) showing a tunneling ohmic contact from $Gd_2O_3(100)/Si(100)$ according to one embodiment.
Figure 10B:
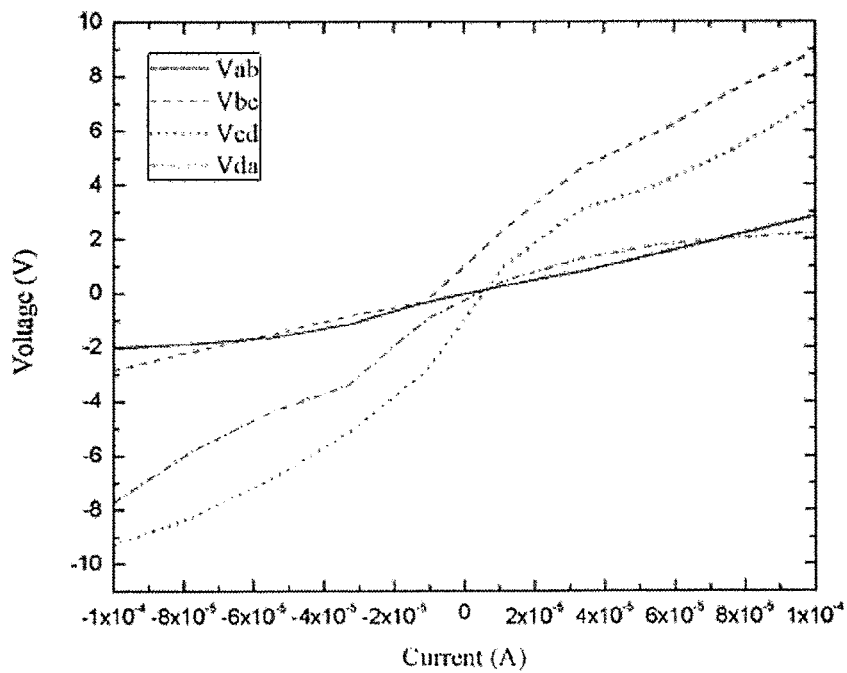
FIG. 10B illustrate an I-V characteristic of samples grown on n-type Si(100) showing a Schottky contact from $Gd_2O_3/GdSi(111)/Si(100)$ sample according to one embodiment.

But even with a poorer crystal structure, the enhancement in electron mobility could be observed only on the sample grown on n-type substrate. The Hall mobility was found to be 1730 $cm^2/V·s$ at room temperature. Whereas the carrier mobility of 360 $cm^2/V·s$ was found on the p-type substrate, revealing no mobility enhancement as to be expected from the formation of the depletion layer. The linear relationship in IV characteristic, as illustrated in FIG. 10A, is additional evidence for the existence of the accumulation region close to the interface. Otherwise, the aluminum contact would have formed a Schottky contact with a lightly doped n-type substrate.

Figure 11A:
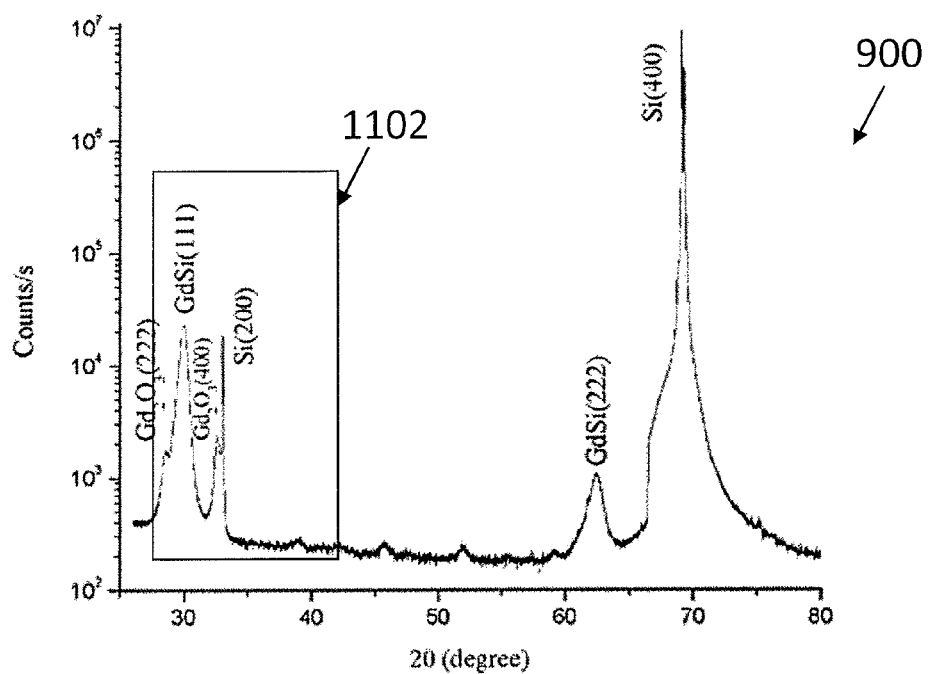
FIG. 11A presents an x-ray diffraction ("XRD") pattern illustrating a polycrystalline of gadolinium oxide, with predominantly GdSi(111) structure, grown on n-type silicon according to o embodiment.
Figure 11B:
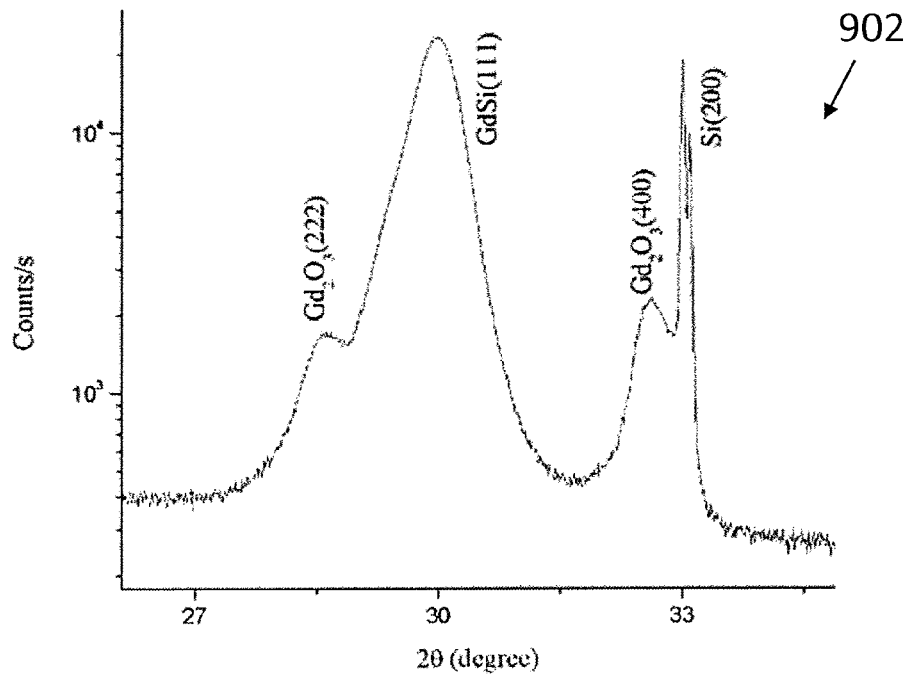
FIG. 11B illustrates a selected portion of the x-ray diffraction ("XRD") pattern of FIG. 11A.

In order to demonstrate the effect from the interfacial layer such as whether silicide will impede the charge transfer or not, the sample was grown at a higher temperature (600° C.) without the external oxygen supply. Without the external oxygen supply, the growth at high temperature will induce the formation of silicides due to a high oxygen vacancy density (3, 20-22). The XRD pattern shows the GdSi(111) peak as the dominant peak, follow by the $Gd_2O_3$ (400) and $Gd_2O_3$ (222) as can be seen in FIGS. 11A-11B. In this case, the accumulation layer is not observed as the IV characteristic, as shown in FIG. 9B, exhibits the exponential relationship indicating Schottky contact. Thus, a thick interfacial layer serves to block the electron transfer or even change the mechanism of the charge reconfiguration, prohibiting the accumulation of the electrons at the interface on the n-type silicon side. It should be noted that the use of hydrogen passivation may be used both during, and before the growth process for possible improvement on the epitaxial growth for $Gd_2O_3$ (100) on n-type Si(100). Additional tools, including Transmission Electron Microscopy (TEM) may be used to further characterize the nature of the active interfacial region.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the invention provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the invention can be modified, if necessary, to employ the systems, functions, and concepts of the various references described above to provide yet further embodiments of the invention.

These and other changes can be made to the invention in light of the above Detailed Description. While the above description describes certain embodiments of the invention, and describes the best mode contemplated, no matter how detailed the above appears in text, the invention can be practiced in many ways. Details of the system may vary considerably in its implementation details, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

While certain aspects of the invention are presented below in certain claim forms, the inventors contemplate the various aspects of the invention in any number of claim forms. For example, while only one aspect of the invention may be recited as a means-plus-function claim under 35 U.S.C sec. 112, sixth paragraph, other aspects may likewise be embodied as a means-plus-function claim, or in other forms, such as being embodied in a computer-readable medium. (Any claims intended to be treated under 35 U.S.C.§112, 6 will begin with the words "means for".) Accordingly, the inventors reserve the right to add additional claims after filing the application to pursue such additional claim forms for other aspects of the invention.

What is claimed is:

1. A method of forming a multilayered structure, the method comprising:
   providing a silicon substrate to a deposition apparatus;
   providing gadolinium oxide ($Gd_2O_3$) to the deposition apparatus;
   pressurizing the pressurized deposition apparatus to a predetermined pressure;
   heating the silicon substrate to a predetermined temperature;
   evaporating the gadolinium oxide so that the gadolinium oxide orientated in the 100 direction ($Gd_2O_3$ (100)) is grown on a layer of the silicon substrate having an orientation in the 100 direction (Si(100)).

2. The method of claim 1, wherein an electron mobility at an interface of $Gd_2O_3$(100) and Si(100)) is about 1760 $cm^2$/V·s.

3. The method of claim 1, further comprising hydrogen passivating the silicon substrate prior to growing the gadolinium oxide thereon.

4. The method of claim 1, wherein the evaporating the gadolinium oxide comprises evaporating the gadolinium oxide at a rate of between about 0.05-2 Å/sec.

5. The method of claim 1, further comprising introducing oxygen to the deposition apparatus while the evaporating the gadolinium oxide.

6. The method of claim 1, wherein the predetermined pressure comprises a pressure between the range of $3 \times 10^{-7}$ to $1 \times 10^{-9}$ Torr.

7. The method of claim 1, wherein the predetermined temperature comprises 200° C.

8. The method of claim 1, further comprising removing the substrate from the deposition apparatus when the $Gd_2O_3$ (100) is grown on Si(100) to a predetermined thickness.

9. The method of claim 8, wherein the predetermined thickness comprises a range from about 20 nm to 150 nm.

10. The method of claim 8, wherein the predetermined thickness is about 50 nm.

11. The method of claim 1, wherein the silicon substrate comprises p-type silicon.

12. The method of claim 1, wherein the $Gd_2O_3$ (100) is grown directly on Si(100) so that oxygen vacancies are created at the surface of the Si(100).

13. The method of claim 1, wherein $Gd_2O_3$ is heated to 200° C. at a rate of about 10° C./minute.

14. The method of claim 1, further comprising attaching contacts to the $Gd_2O_3(100)$ in a configuration to operate as a field effect transistor.

\* \* \* \* \*